(12) United States Patent
Afsahi et al.

(10) Patent No.: US 7,545,855 B2
(45) Date of Patent: *Jun. 9, 2009

(54) PHASE SHIFTER AND CURRENT MODE MIXER

(75) Inventors: Ali Afsahi, San Diego, CA (US); Arya Reza Behzad, Poway, CA (US)

(73) Assignee: Broadcom Corporation, Irvine, CA (US)

(*) Notice: Subject to any disclaimer, the term of this patent is extended or adjusted under 35 U.S.C. 154(b) by 529 days.

This patent is subject to a terminal disclaimer.

(21) Appl. No.: 11/224,609

(22) Filed: Sep. 12, 2005

(65) Prior Publication Data

US 2007/0058747 A1 Mar. 15, 2007

Related U.S. Application Data

(60) Provisional application No. 60/715,365, filed on Sep. 8, 2005.

(51) Int. Cl.
*H04B 1/38* (2006.01)
(52) U.S. Cl. .............................. 375/219; 455/73; 710/1
(58) Field of Classification Search ................. 375/219; 455/73; 710/1
See application file for complete search history.

(56) References Cited

U.S. PATENT DOCUMENTS

| | | | | |
|---|---|---|---|---|
| 3,394,322 A | * | 7/1968 | Moses | 332/146 |
| 6,094,084 A | * | 7/2000 | Abou-Allam et al. | 327/359 |
| 6,958,665 B2 | * | 10/2005 | Allison et al. | 333/164 |
| 6,992,546 B2 | * | 1/2006 | Chiang et al. | 333/164 |
| 2002/0135513 A1 | * | 9/2002 | Paschen et al. | 342/371 |
| 2003/0067359 A1 | * | 4/2003 | Darabi et al. | 331/46 |
| 2003/0091127 A1 | * | 5/2003 | Jensen et al. | 375/324 |
| 2003/0109233 A1 | * | 6/2003 | Shi et al. | 455/116 |
| 2003/0161413 A1 | * | 8/2003 | Jensen et al. | 375/319 |
| 2003/0169827 A1 | * | 9/2003 | Shi et al. | 375/295 |
| 2003/0171110 A1 | * | 9/2003 | Shi et al. | 455/324 |
| 2003/0202616 A1 | * | 10/2003 | Jensen et al. | 375/316 |
| 2003/0202618 A1 | * | 10/2003 | Jensen et al. | 375/319 |
| 2003/0202619 A1 | * | 10/2003 | Ibrahim et al. | 375/319 |
| 2004/0081256 A1 | * | 4/2004 | Shi et al. | 375/317 |
| 2004/0102170 A1 | * | 5/2004 | Jensen et al. | 455/260 |
| 2004/0161026 A1 | * | 8/2004 | Jensen et al. | 375/224 |
| 2005/0003767 A1 | * | 1/2005 | Song | 455/75 |

* cited by examiner

*Primary Examiner*—Juan A Torres
(74) *Attorney, Agent, or Firm*—Garlick, Harrison & Markison; James A. Harrison

(57) ABSTRACT

An integrated circuit radio transceiver comprises an integrated phase shift mixer for generating a phase and frequency shifted output signal to at least a portion of one of a transmitter or receiver front end. The integrated phase shift mixer includes a phase shift block that is operable to produce a phase shifted current signal at an output of the phase shift block and a mixer that is operable to produce the phase and frequency shifted output signal based upon the phase shifted current signal. One aspect of the present invention is that the phase shift block produces an output as a current signal and the mixer block is operably disposed and formed to receive the current signal produced by the phase shift block. Thus, the mixer includes a folded cascode mixer that provides a substantially low input impedance.

19 Claims, 7 Drawing Sheets

PHASE SHIFTER AND CURRENT MODE MIXER

CROSS-REFERENCE TO RELATED APPLICATION

The present U.S. Utility Patent Application claims priority pursuant to 35 U.S.C. § 119(e) to the following U.S. Provisional Patent Application which is hereby incorporated herein by reference in its entirety and made part of the present U.S. Utility Patent Application for all purposes:
1. U.S. Provisional Application Ser. No. 60/715,365, entitled "Phase Shifter and Current Mode Mixer," filed Sep. 8, 2005, expired.

BACKGROUND

1. Technical Field

The present invention relates to wireless communications and, more particularly, to a method for phase and frequency shifting an ingoing RF signal.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a public switched telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier stage. The data modulation stage converts raw data into baseband signals in accordance with the particular wireless communication standard. The one or more intermediate frequency stages mix the baseband signals with one or more local oscillations to produce RF signals. The power amplifier stage amplifies the RF signals prior to transmission via an antenna.

Typically, the data modulation stage is implemented on a baseband processor chip, while the intermediate frequency (IF) stages and power amplifier stage are implemented on a separate radio processor chip. Historically, radio integrated circuits have been designed using bipolar circuitry, allowing for large signal swings and linear transmitter component behavior. Therefore, many legacy baseband processors employ analog interfaces that communicate analog signals to and from the radio processor.

Multiple antenna systems are known to be an efficient solution to increase data rate and/or increase robustness by taking advantage of multi-path scattering present in most indoor and urban environments. Phase shifters (PS) are used to set the phase of the received signal from each antenna. These radio frequency (RF) phase shifters have to meet certain requirements, such as having adjustable phase with the range of 360 degrees, having low loss and control complexity, consuming low power, and/or being compact and low cost to be able to be used in commercial applications. As such, it is desirable to provide a phase shifter (e.g., an RF phase shifter) that has a high shift range, a small size, a low cost, and/or a low power consumption. Further, it is desirable to provide a phase and frequency shift circuit that eliminates circuit parts, decreases noise and, more generally, operates in a more desirable manner.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
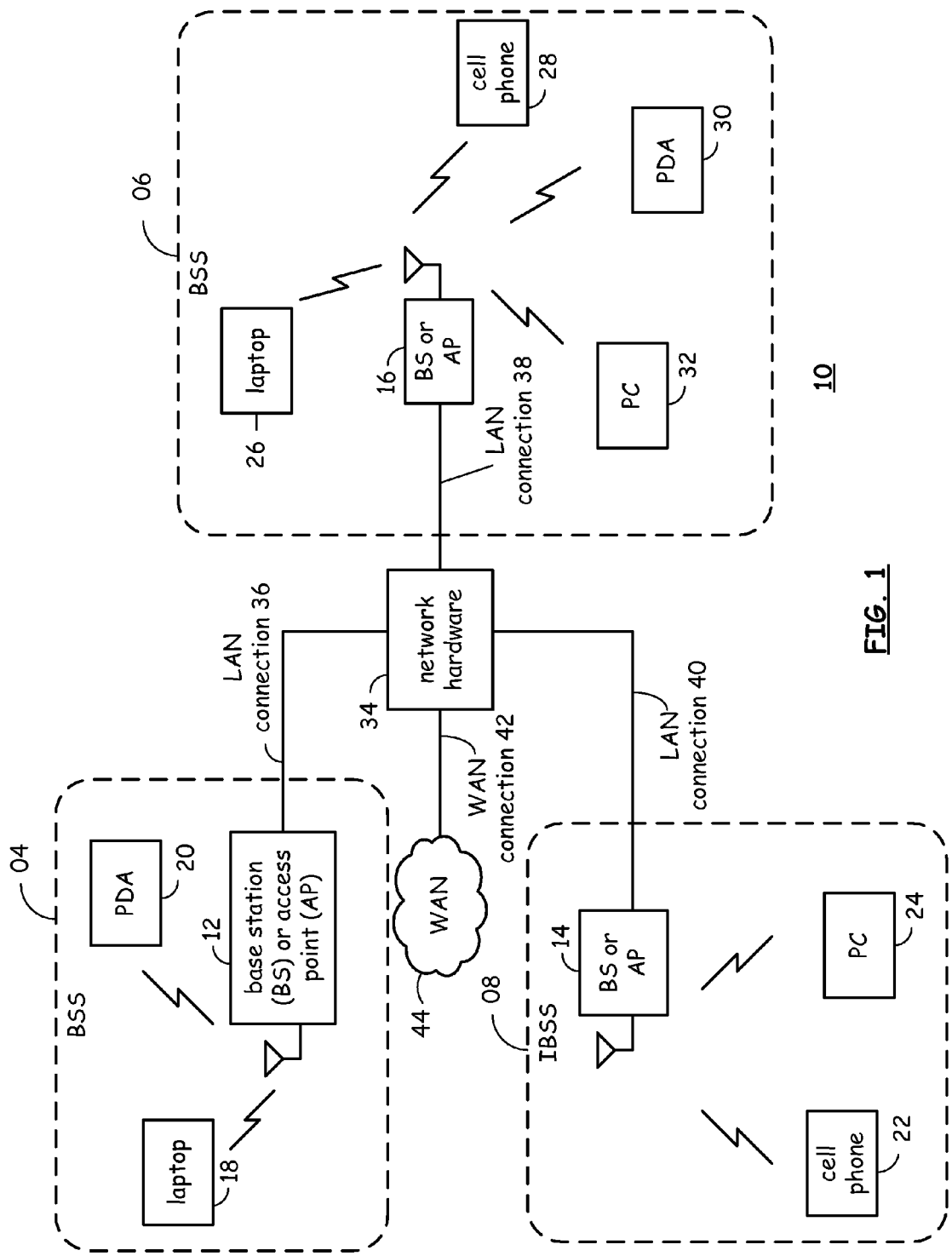
FIG. 1 is a functional block diagram illustrating a communication system that includes circuit devices and network elements and operation thereof according to one embodiment of the invention.

FIG. 1 is a functional block diagram illustrating a communication system that includes circuit devices and network elements and operation thereof according to one embodiment of the invention. More specifically, a plurality of network service areas 04, 06 and 08 are a part of a network 10. Network 10 includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail with reference to the subsequent Figures herein.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network (WAN) connection 42 for the communication system 10 to an external network element such as WAN 44. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

One typical application for an integrated circuit regulator is within an integrated circuit radio transceiver within any one of the above described wireless communication devices. Thus, should a short condition materialize temporarily for any one of the above described devices, the regulator of the present invention would facilitate the device being able to resume communication with minimal delay to reduce the likelihood of a missed communication.

Figure 2:
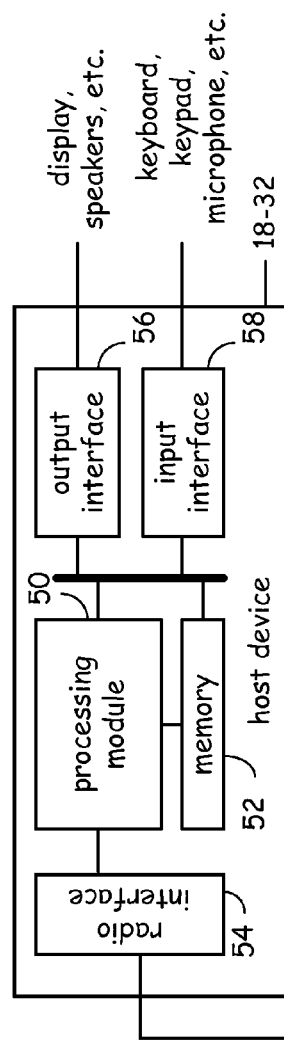
FIG. 2 is a schematic block diagram illustrating a wireless communication host device and an associated radio.
Figure 2:
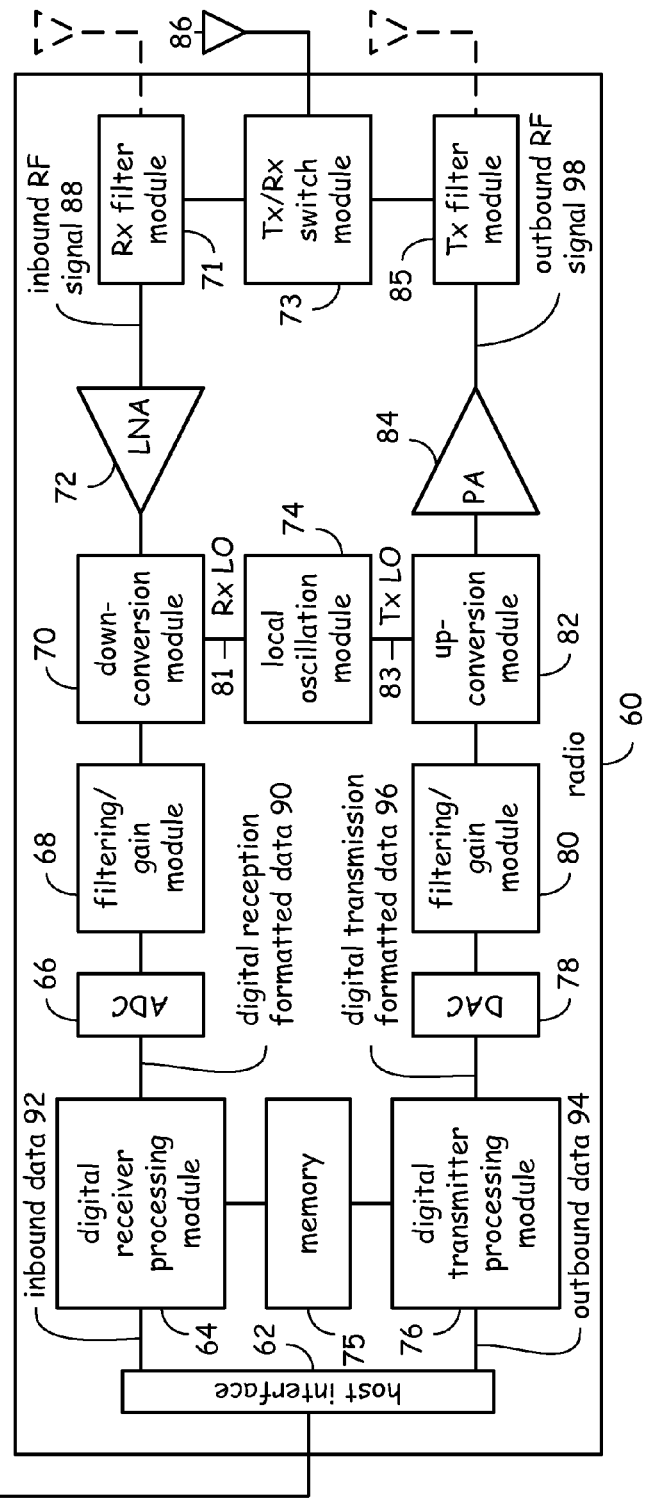

FIG. 2 is a schematic block diagram illustrating a wireless communication host device 18-32 and an associated radio 60 which may include an embodiment of the present invention for a linear regulator for providing over-current protection. For cellular telephone hosts, radio 60 is a built-in component. For personal digital assistants hosts, laptop hosts, and/or personal computer hosts, the radio 60 may be built-in or an externally coupled component.

As illustrated, wireless communication host device 18-32 includes a processing module 50, a memory 52, a radio interface 54, an input interface 58 and an output interface 56. Processing module 50 and memory 52 execute the corresponding instructions that are typically done by the host device. For example, for a cellular telephone host device, processing module 50 performs the corresponding communication functions in accordance with a particular cellular telephone standard.

Radio interface 54 allows data to be received from and sent to radio 60. For data received from radio 60 (e.g., inbound data), radio interface 54 provides the data to processing module 50 for further processing and/or routing to output interface 56. Output interface 56 provides connectivity to an output device such as a display, monitor, speakers, etc., such that the received data may be displayed. Radio interface 54 also provides data from processing module 50 to radio 60. Processing module 50 may receive the outbound data from an input device such as a keyboard, keypad, microphone, etc., via input interface 58 or generate the data itself. For data received via input interface 58, processing module 50 may perform a corresponding host function on the data and/or route it to radio 60 via radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (Tx/Rx) switch module 73, a local oscillation module 74, a memory 75, a digital transmitter processing module 76, a digital-to-analog converter 78, a filtering/gain module 80, an up-conversion module 82, a power amplifier 84, a transmitter filter module 85, and an antenna 86 operatively coupled as shown. The antenna 86 is shared by the transmit and receive paths as regulated by the Tx/Rx switch module 73. The antenna implementation will depend on the particular standard to which the wireless communication device is compliant.

Digital receiver processing module 64 and digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and modulation. Digital receiver and transmitter processing modules 64 and 76, respectively, may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when digital receiver processing module 64 and/or digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 75 stores, and digital receiver processing module 64 and/or digital transmitter processing module 76 executes, operational instructions corresponding to at least some of the functions illustrated herein.

In operation, radio 60 receives outbound data 94 from wireless communication host device 18-32 via host interface 62. Host interface 62 routes outbound data 94 to digital transmitter processing module 76, which processes outbound data 94 in accordance with a particular wireless communication standard or protocol (e.g., IEEE 802.11(a), IEEE 802.11b, Bluetooth, etc.) to produce digital transmission formatted data 96. Digital transmission formatted data 96 will be a digital baseband signal or a digital low IF signal, where the low IF typically will be in the frequency range of one hundred kilohertz to a few megahertz.

Digital-to-analog converter 78 converts digital transmission formatted data 96 from the digital domain to the analog domain. Filtering/gain module 80 filters and/or adjusts the gain of the analog baseband signal prior to providing it to up-conversion module 82. Up-conversion module 82 directly converts the analog baseband signal, or low IF signal, into an RF signal based on a transmitter local oscillation 83 provided by local oscillation module 74. Power amplifier 84 amplifies the RF signal to produce an outbound RF signal 98, which is filtered by transmitter filter module 85. The antenna 86 transmits outbound RF signal 98 to a targeted device such as a base station, an access point and/or another wireless communication device.

Radio 60 also receives an inbound RF signal 88 via antenna 86, which was transmitted by a base station, an access point, or another wireless communication device. The antenna 86 provides inbound RF signal 88 to receiver filter module 71 via Tx/Rx switch module 73, where Rx filter module 71 bandpass filters inbound RF signal 88. The Rx filter module 71 provides the filtered RF signal to low noise amplifier 72, which amplifies inbound RF signal 88 to produce an amplified inbound RF signal. Low noise amplifier 72 provides the amplified inbound RF signal to down-conversion module 70, which directly converts the amplified inbound RF signal into an inbound low IF signal or baseband signal based on a receiver local oscillation 81 provided by local oscillation module 74. Down-conversion module 70 provides the inbound low IF signal or baseband signal to filtering/gain module 68. Filtering/gain module 68 may be implemented in accordance with the teachings of the present invention to filter and/or attenuate the inbound low IF signal or the inbound baseband signal to produce a filtered inbound signal.

Analog-to-digital converter 66 converts the filtered inbound signal from the analog domain to the digital domain to produce digital reception formatted data 90. Digital receiver processing module 64 decodes, descrambles, demaps, and/or demodulates digital reception formatted data 90 to recapture inbound data 92 in accordance with the particular wireless communication standard being implemented by radio 60. Host interface 62 provides the recaptured inbound data 92 to the wireless communication host device 18-32 via radio interface 54.

As one of average skill in the art will appreciate, the wireless communication device of FIG. 2 may be implemented using one or more integrated circuits. For example, the host device may be implemented on a first integrated circuit, while digital receiver processing module 64, digital transmitter processing module 76 and memory 75 may be implemented on a second integrated circuit, and the remaining components of radio 60, less antenna 86, may be implemented on a third integrated circuit. As an alternate example, radio 60 may be implemented on a single integrated circuit. As yet another example, processing module 50 of the host device and digital receiver processing module 64 and digital transmitter processing module 76 may be a common processing device implemented on a single integrated circuit.

Memory 52 and memory 75 may be implemented on a single integrated circuit and/or on the same integrated circuit as the common processing modules of processing module 50, digital receiver processing module 64, and digital transmitter processing module 76. As will be described, it is important that accurate oscillation signals are provided to mixers and conversion modules. A source of oscillation error is noise coupled into oscillation circuitry through integrated circuitry biasing circuitry. One embodiment of the present invention reduces the noise by providing a selectable pole low pass filter in current mirror devices formed within the one or more integrated circuits.

Local oscillation module 74 includes circuitry for adjusting an output frequency of a local oscillation signal provided therefrom. Local oscillation module 74 receives a frequency correction input that it uses to adjust an output local oscillation signal to produce a frequency corrected local oscillation signal output. While local oscillation module 74, up-conversion module 82 and down-conversion module 70 are implemented to perform direct conversion between baseband and RF, it is understood that the principles herein may also be applied readily to systems that implement an intermediate frequency conversion step at a low intermediate frequency.

Figure 3:
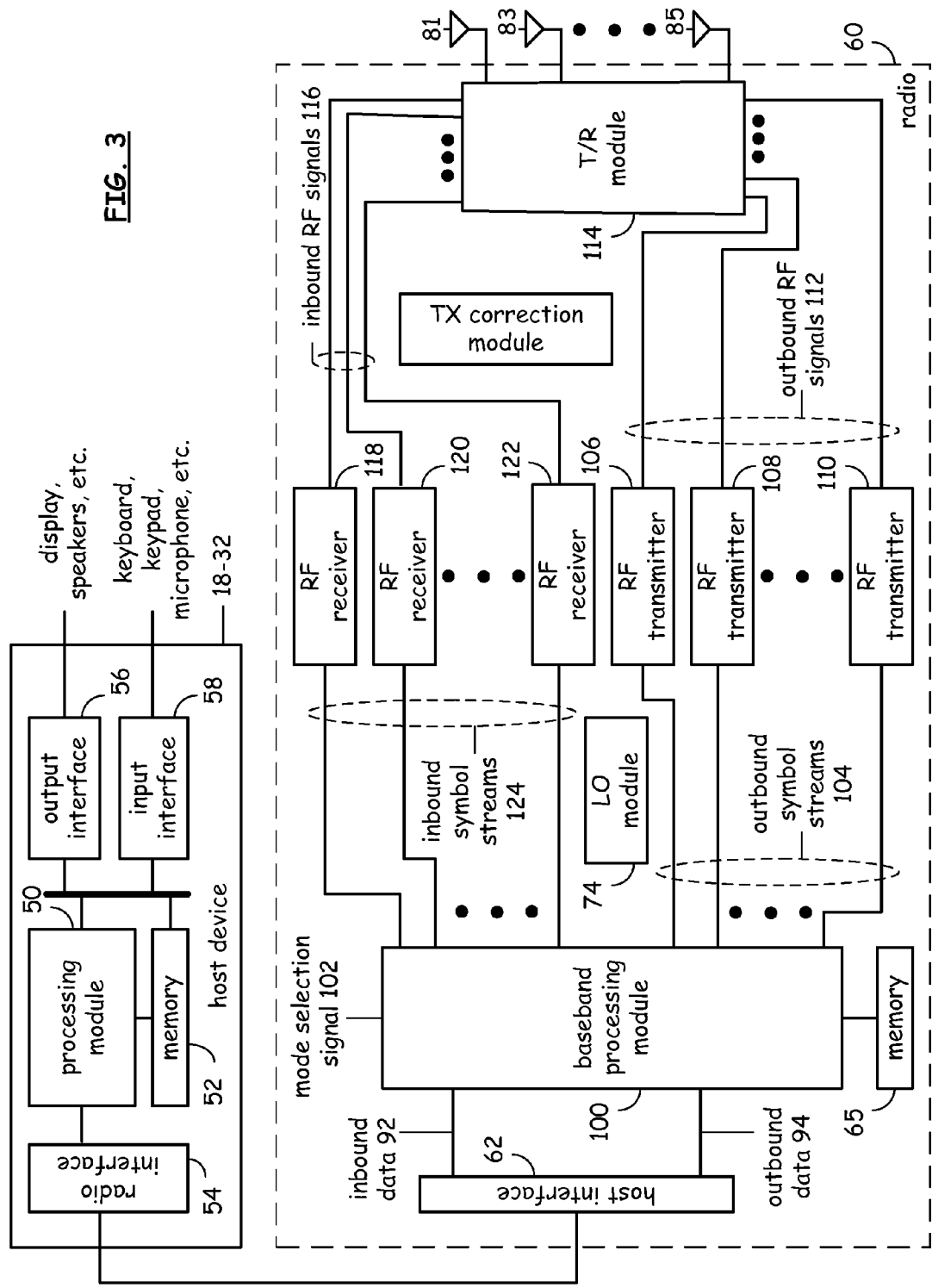
FIG. 3 is a schematic block diagram illustrating a wireless communication device that includes a host device and an associated radio.

FIG. 3 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a baseband processing module 100, memory 65, a plurality of radio frequency (RF) transmitters 106-110, a transmit/receive (T/R) module 114, a plurality of antennas 81-85, a plurality of RF receivers 118-122, and a local oscillation module 74. The baseband processing module 100, in combination with operational instructions stored in memory 65, executes digital receiver functions and digital transmitter functions, respectively. The digital receiver functions include, but are not limited to, digital intermediate frequency to baseband conversion, demodulation, constellation demapping, decoding, deinterleaving, fast Fourier transform, cyclic prefix removal, space and time decoding, and/or descrambling. The digital transmitter functions include, but are not limited to, scrambling, encoding, interleaving, constellation mapping, modulation, inverse fast Fourier transform, cyclic prefix addition, space and time encoding, and digital baseband to IF conversion. The baseband processing module 100 may be implemented using one or more processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 65 may be a single memory device or a plurality of memory devices. Such a memory device may be a read-only memory, random access memory, volatile memory, non-volatile memory, static memory, dynamic memory, flash memory, and/or any device that stores digital information. Note that when the baseband processing module 100 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The baseband processing module 100 receives the outbound data 94 and, based on a mode selection signal 102, produces one or more outbound symbol streams 104. The mode selection signal 102 will indicate a particular mode of operation that is compliant with one or more specific modes of the various IEEE 802.11 standards. For example, the mode selection signal 102 may indicate a frequency band of 2.4 GHz, a channel bandwidth of 20 or 22 MHz and a maximum bit rate of 54 megabits-per-second. In this general category, the mode selection signal 102 will further indicate a particular rate ranging from 1 megabit-per-second to 54 megabits-per-second. In addition, the mode selection signal 102 will indicate a particular type of modulation, which includes, but is not limited to, Barker Code Modulation, BPSK, QPSK, CCK, 16 QAM and/or 64 QAM. The mode selection signal 102 may also include a code rate, a number of coded bits per subcarrier (NBPSC), coded bits per OFDM symbol (NCBPS), and/or data bits per OFDM symbol (NDBPS). The mode selection signal 102 may also indicate a particular channelization for the corresponding mode that provides a channel number and corresponding center frequency. The mode selection signal 102 may further indicate a power spectral density mask value and a number of antennas to be initially used for a MIMO communication.

The baseband processing module 100, based on the mode selection signal 102, produces one or more outbound symbol streams 104 from the outbound data 94. For example, if the mode selection signal 102 indicates that a single transmit antenna is being utilized for the particular mode that has been selected, the baseband processing module 100 will produce a single outbound symbol stream 104. Alternatively, if the mode selection signal 102 indicates 2, 3 or 4 antennas, the baseband processing module 100 will produce 2, 3 or 4 outbound symbol streams 104 from the outbound data 94.

Depending on the number of outbound symbol streams 104 produced by the baseband processing module 100, a corresponding number of the RF transmitters 106-110 will be enabled to convert the outbound symbol streams 104 into outbound RF signals 112. In general, each of the RF transmitters 106-110 includes a digital filter and upsampling module, a digital-to-analog conversion module, an analog filter module, a frequency up conversion module, a power amplifier, and a radio frequency bandpass filter. The RF transmitters 106-110 provide the outbound RF signals 112 to the transmit/receive module 114, which provides each outbound RF signal to a corresponding antenna 81-85.

When the radio 60 is in the receive mode, the transmit/receive module 114 receives one or more inbound RF signals 116 via the antennas 81-85 and provides them to one or more RF receivers 118-122. The RF receiver 118-122 converts the inbound RF signals 116 into a corresponding number of inbound symbol streams 124. The number of inbound symbol streams 124 will correspond to the particular mode in which the data was received. The baseband processing module 100 converts the inbound symbol streams 124 into inbound data 92, which is provided to the host device 18-32 via the host interface 62.

As one of average skill in the art will appreciate, the wireless communication device of FIG. 3 may be implemented using one or more integrated circuits. For example, the host device may be implemented on a first integrated circuit, the baseband processing module 100 and memory 65 may be implemented on a second integrated circuit, and the remaining components of the radio 60, less the antennas 81-85, may be implemented on a third integrated circuit. As an alternate example, the radio 60 may be implemented on a single integrated circuit. As yet another example, the processing module 50 of the host device and the baseband processing module 100 may be a common processing device implemented on a single integrated circuit. Further, the memory 52 and memory 65 may be implemented on a single integrated circuit and/or on the same integrated circuit as the common processing modules of processing module 50 and the baseband processing module 100.

Figure 4:
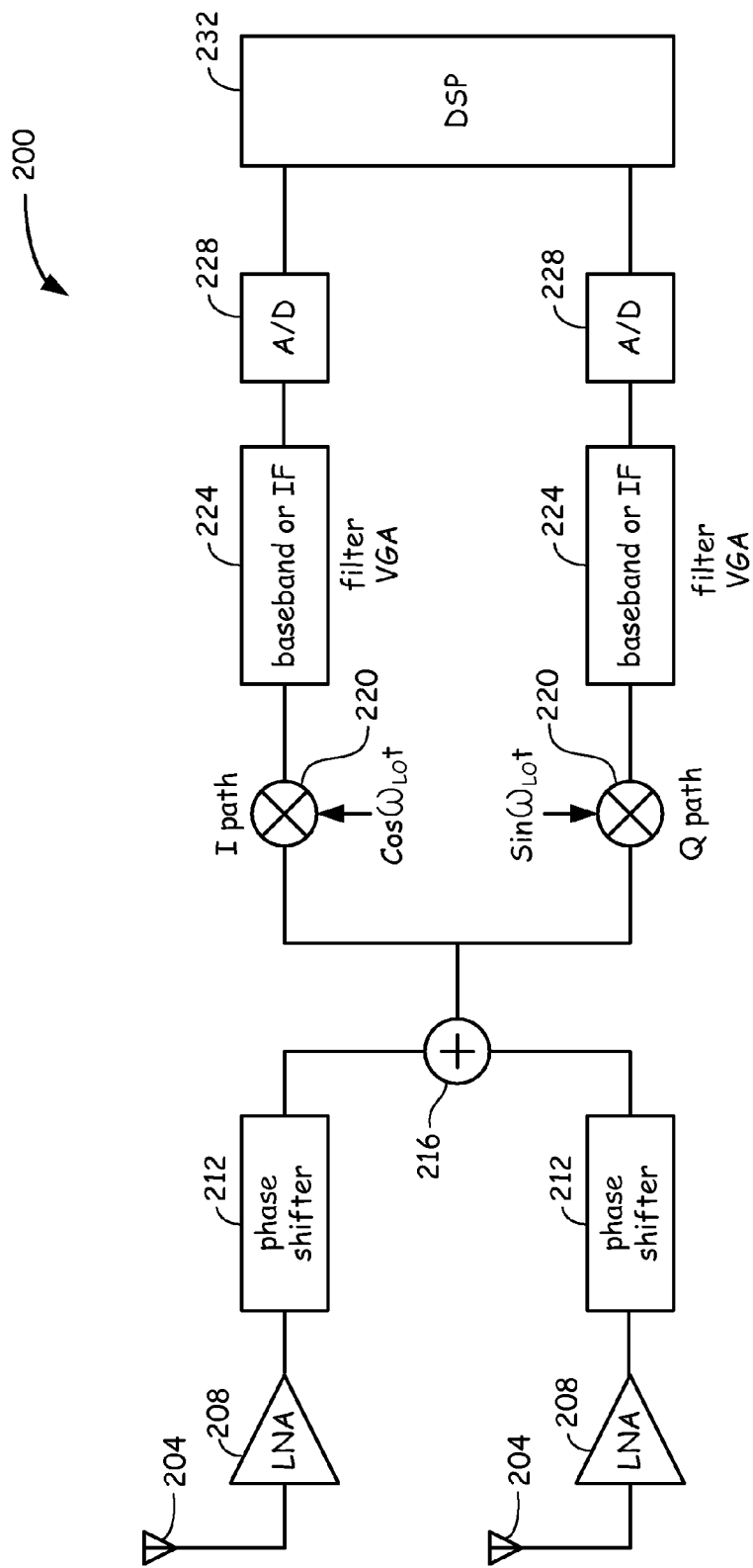
FIG. 4 is a functional schematic block diagram of a radio receiver according to one embodiment of the present invention.

FIG. 4 is a functional schematic block diagram of a radio receiver according to one embodiment of the present invention. Referring to FIG. 4, a receiver 200 includes antennas 204 that are operable to receive multi-path components of an in-going RF signal and are operably connected to produce the in-going RF signals to a pair of low noise amplifiers (LNAs) 208. LNAs 208 produce amplified multi-path components to a pair of phase shifters 212 that are operable to phase shift the multi-path components to produce phase-aligned signal current components to a combiner 216. Combiner 216 then produces a combined in-going RF signal to a pair of mixing blocks 220 that are operable to generate in-phase (I) and quadrature phase (Q) path components at a frequency shifted frequency. The frequency shifted frequency may be either to a baseband frequency or intermediate frequency signal as those terms are understood by one of average skill in the art. The frequency shifted I and Q path components are then produced to a pair of variable gain amplifiers (VGAs) 224 that provide variable gain low-pass/band-pass filtering. It is understood that VGAs 224 may include a plurality of filters and/or amplifiers. The VGAs 224 then produce low-pass/band-passfiltered and amplified in-going frequency shifted continuous waveform signals to a pair of analog-to-digital converters 228 that produce ingoing digital signals to a digital signal processor (or a communications controller) 232 for subsequent processing.

In one embodiment, the digital signal processor 232 is operating in accordance with one or more standards, including but not limited to, IEEE 802.11, Bluetooth, advanced mobile phone services (AMPS), global systems for mobile communications (GSM), code division multiple access (CDMA), local multi-point distribution systems (LMDS), multi-channel-multi-point distribution systems (MMDS), and/or variations thereof. In an exemplary embodiment, the digital signal processor 232 is coupled to the phase shifters 212 and is an integrated digital controller with multiple inputs and outputs, such as a transmit data output and a receive data input. In the illustrated receiver 200, each of the phase shifters 212 is coupled to a corresponding one of the antennas 204 by way of an LNA 208. In one embodiment, each of the phase shifters 212 provides a 0 to 360 degrees of phase shift.

One of the mixing blocks 220 is an in-phase (I) path mixer (for mixing a cosine waveform with the input signal to produce a frequency shifted output) and another one of the frequency mixers is a quadrature (Q) path mixer (or for mixing a sine waveform with the input signal). As is known by one of average skill in the art, the step of mixing two signals typically comprises a Gilbert cell to multiply to sinusoidal waveforms to create a frequency shifted output signal.

Each of the intermediate processing stages comprising VGAs 224 can be a filter and/or a variable gain amplifier (VGA). In an exemplary operation of the illustrated receiver 200 of FIG. 4, the phase shifters 212 receive inbound RF signals from the antennas 204 via one of the low noise amplifiers (LNAs) 208, respectively, coupled between the antennas 204 and the phase shifters 212. Each of the phase shifters 212 then respectively phase shifts the RF signals as necessary to phase align the received multi-path components of an ingoing RF signal. The phase-shifted RF signals are then combined by the combiner 216 into combined-phase-shifted RF signals (e.g., having a first 0-360° of phase shift and a second 0-360° of phase shift). The mixing blocks 220 then respectively mix the combined RF signals into a first frequency shifted (mixed) signal (e.g., having a sine waveform) and a second frequency shifted signal (e.g., having a cosine waveform). The intermediate processing stages, or VGAs 224, then preliminarily process the first and second frequency shifted signals, respectively (e.g., by filtering and/or amplifying the signals) to produce the low-pass/band-passfiltered and amplified ingoing continuous waveform signals to the analog-to-digital converters 228 that produce the ingoing digital signals to the digital signal processor 232.

The digital signal processor (or communications controller) 232 then recovers and/or further processes the data in the ingoing digital signals in accordance with the particular communications standard in use. In view of the foregoing, an exemplary embodiment of the present invention provides an RF phase shifter. As will be described in greater detail, the phase shifter, combiner and mixing blocks are formed as one integrated block that operate on current signals without converting a current signal output of the phase shifter into a voltage signal and then back into a current signal in the downstream mixer.

Figure 5:
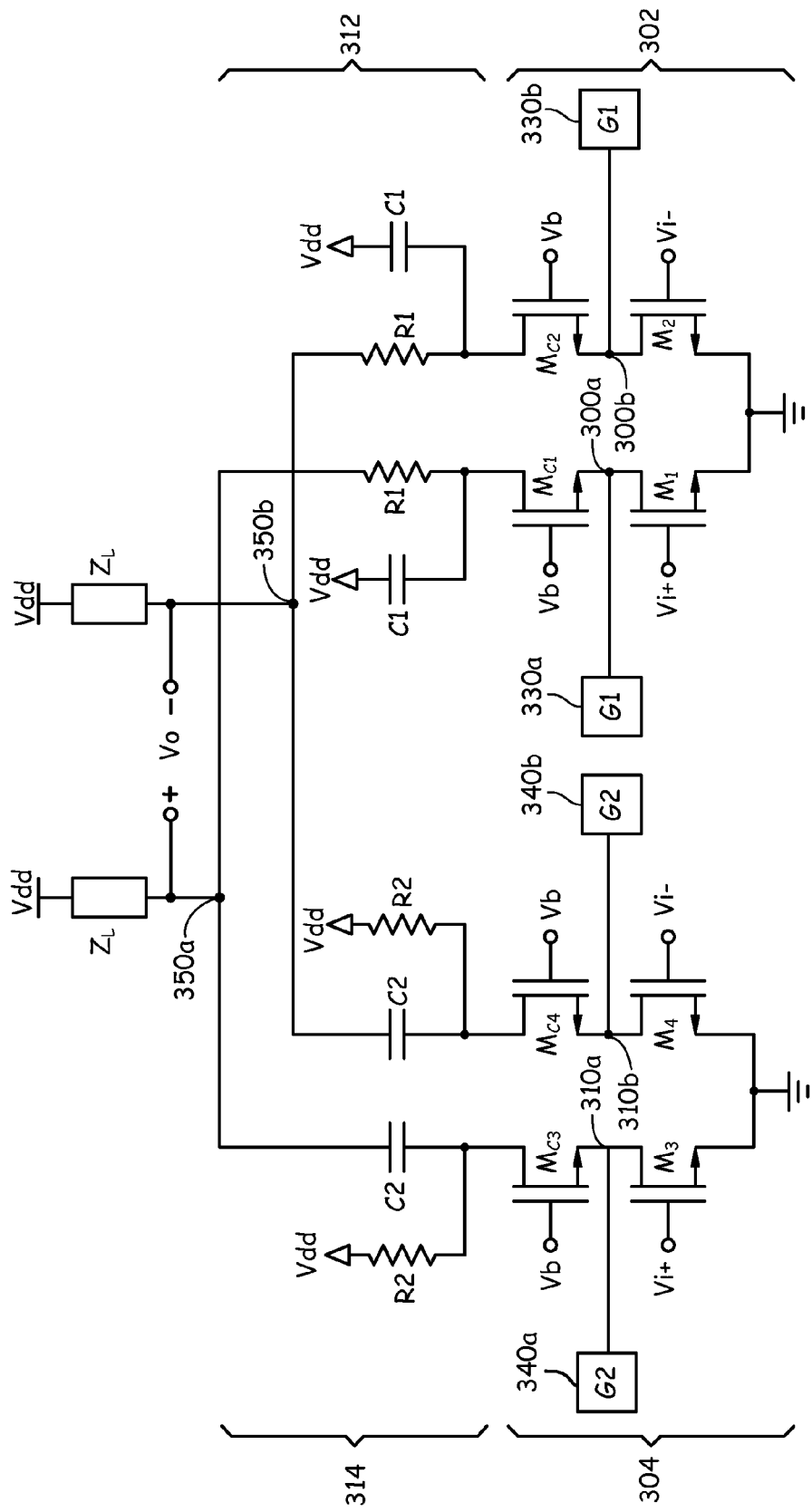
FIG. 5 is a functional schematic diagram of an embodiment of the present invention of a differential phase shifter.

FIG. 5 is a functional schematic diagram of an embodiment of the present invention of a differential phase shifter. First and second differential pairs 302, 304 include differential inputs Vi+, Vi− that are fed from an output of a previous stage (not shown). The first and second differential pairs 302, 304 convert voltage to current. By passing the currents through the RC circuit pairs 312, 314, the 90° phase shifted signals are generated and combined with each other at nodes 350a, 350b to give the final signal. By changing the gain of each of the first and second differential pairs 302, 304, via gain controllers 330a, 330b, 340a, 340b, the desired phase or phase angle θ can be generated at the output of nodes 350a, 350b. To get 360° phase shifting, the embodiment of FIG. 4 is operable to change the polarity of the input or output of the first and second differential pairs 302, 304.

To explain in more detail, loads $Z_L$ are coupled to the first and second differential pairs 302, 304 via nodes 350a, 350b. The first and second differential pairs 302, 304 include cascoded transistor pairs having n-channel MOSFETs (e.g. $M_{c1}$ and $M_1$) serially coupled together such that the source of a cascode transistor (e.g. MOSFET $M_{c1}$) is coupled to the drain of a transconductance transistor (e.g. MOSFET $M_1$) via a connection-control node (e.g., 300a).

In addition, gain controller 330a, 330b, 340a, 340b is respectively coupled to each connection-control node 300a, 300b, 310a, 310b. In this embodiment, at least one of differential input voltages Vi+, Vi− is coupled to each of the transconductance transistors ($M_1$-$M_4$) of the first and second differential pairs 302, 304. The transconductance transistors ($M_1$-$M_4$) are for changing voltage(s) into current(s). Further, the cascode transistors ($M_{c1}$-$M_{c4}$) of the first and second differential pairs 302, 304 are, by way of example, coupled to control voltages Vb. The cascode transistors ($M_{c1}$-$M_{c4}$) are included for impedance balancing, gain control, increasing output impedance, reducing an effective capacitance input, and/or improving linearity.

In operation, the first differential pair 302 converts a differential input voltage into a first differential current as a function of an input voltage Vi+, Vi−. In addition, the gain controllers 330a, 330b via the connection-control nodes 300a, 300b control a gain of the first differential current. In a similar manner, the second differential pair 304 controls the output current and gain of the second differential pair 304. For example, the gain controllers 340a, 340b via the connection-control nodes 310a, 310b control a gain of a second differential current after the second differential pair 304 current converts a differential input voltage into the second differential current in accordance with the input voltage Vi+, Vi−.

As such, by passing the currents outputted from the first and second differential pairs 302, 304 through the RC-CR circuit pairs 312, 314, the 90° phase shifted signals are generated and added in nodes 350a, 350b (and/or the loads $Z_L$) to give the final signal. In addition, by changing the gain of the each of the first and second differential pairs 302, 304 via the gain controllers 330a, 330b, 340a, 340b, the desired phase or phase angle θ can be generated after adding the two currents. To get 360° phase shifting, the embodiment of FIG. 4 needs only to change the polarity of the currents initially generated by one or both of the first and second differential pairs 302, 304.

Figure 6:
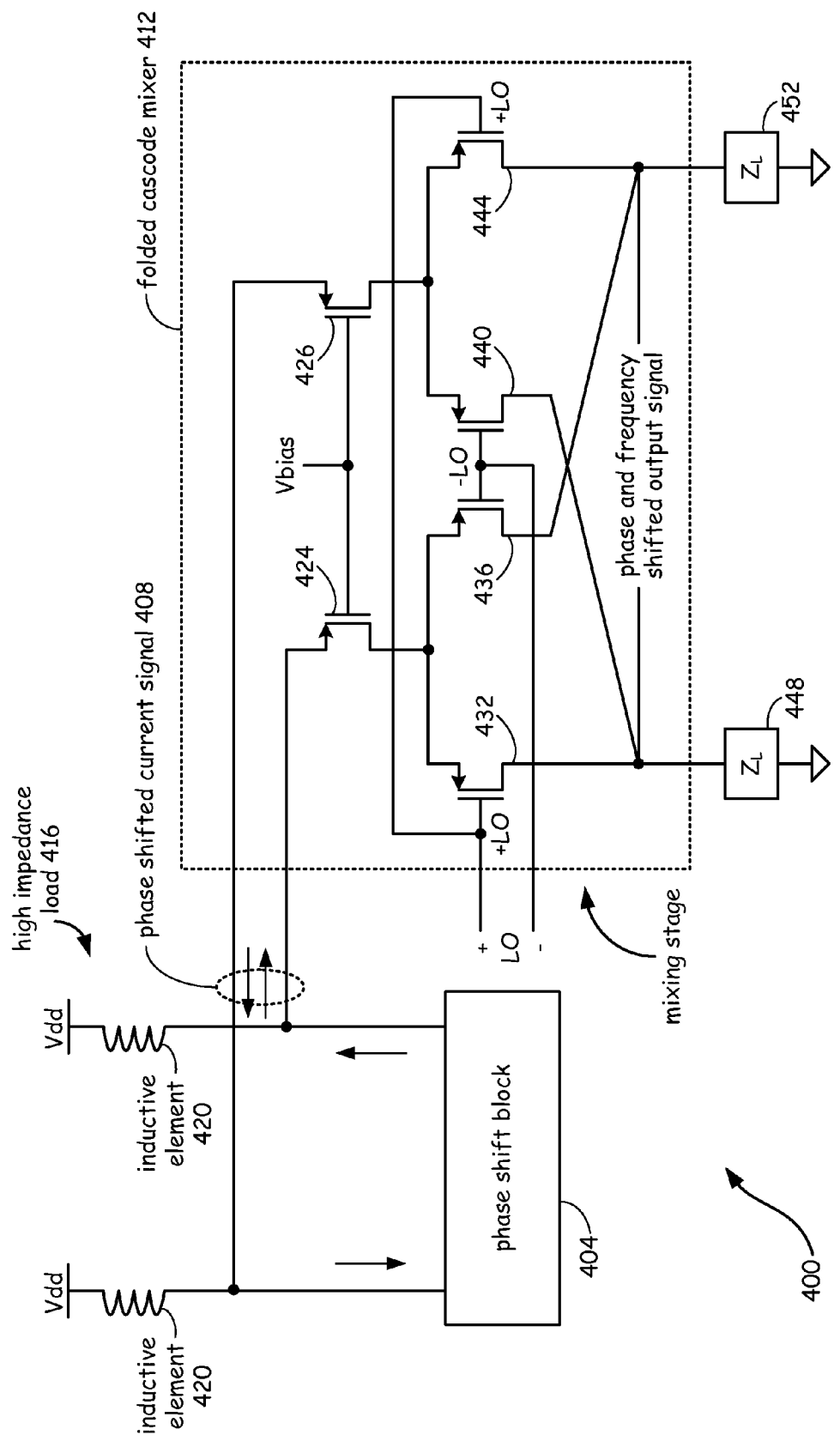
FIG. 6 is a functional schematic diagram of an integrated phase shift mixer formed according to one embodiment of the present invention.

FIG. 6 is a functional schematic diagram of an integrated phase shift mixer formed according to one embodiment of the present invention. Referring to FIG. 6, an integrated phase shift mixer 400 includes a phase shift block 404 that is operably disposed to produce a phase shifted current signal 408 to a folded cascode mixer 412. As may further be seen, the output of phase shift block 404 is operably coupled to a high impedance load shown generally at 416 which is further coupled to a supply Vdd.

Generally, the folded cascode mixer 412 is configured to provide a substantially low input impedance in comparison to the high impedance load 416. Accordingly, the output of phase shift block 404 generates phase shifted current signal 408 that flows into the folded cascode mixer 412 instead of into the high impedance load 416. In the described embodiment of the invention, the high impendence load 416 includes a pair of inductive elements 420. Inductive elements 420 may be replaced by other known load devices including resistors, capacitors, RC tanks, transistors or any combination of the same with or without inductive elements.

Continuing to examine FIG. 6, the output of phase shift block 404 is specifically coupled to the source terminals of a pair of p-channel MOSFETs, namely MOSFETs 424 and 426. MOSFETs 424 and 426 are cascode devices and provide a low impedance cascode input. Specifically, because the cascode MOSFETs 424 and 426 are coupled to the output of phase shift block 404 at the source terminals of the MOSFETs 424, a low impedance input is provided therefor. The drain terminals of cascode MOSFETs 424 and 426 are then coupled to a standard mixer switching block that includes four p-channel MOSFETs 432, 436, 440, 444. Specifically, the drain terminal of MOSFETs 424 is coupled to the source terminals of MOSFETs 432 and 436 while the drain terminal of MOSFET 426 is coupled to the source terminal of MOSFETs 440 and 444. The p-channel MOSFETs 432, 436, 440, 444 are cross coupled substantially as shown and are further coupled to load devices 448, 452. In the described embodiment of the invention, load devices 448 and 452 are resistive devices, though other types of load circuits or devices may be used therefor. More specifically, the drain terminals of MOSFETs 432 and 440 are coupled to each other and to load device 448, while the drain terminals of MOSFETs 436 and 444 are coupled to each other and to load device 452.

In operation, the mixer block of FIG. 6 comprises a plurality of p-channel MOSFETs configured as a folded cascode mixer. As such, known mixing operations occur even though the configuration provides a low impedance input to draw current from the phase shift block 404. Moreover, in traditional mixer blocks, an input signal is applied to the gate terminals of the cascode input devices. Here, however, the input signal is provided in the form of a current to the source terminals of the p-channel MOSFETs 424. Thus, the gate terminals of MOSFETs 424 and 426 are merely coupled to receive a bias signal for DC operation.

While the above described embodiment of the invention includes a folded cascode mixer 412, an alternate embodiment includes a mixer that does not have the low impedance cascode input provided by MOSFETs 424 and 426. Because of the described mixing block configuration, one embodiment contemplates the folded cascode mixer 412 being coupled directly to receive the phase shifted current signal 408. Accordingly, phase shifted current signal 408 is provided directly to the source terminals of MOSFETs 432-444. Further, while the described embodiment is for a phase shift mixer that is operable to provide a phase and frequency shifted ingoing signal for a radio receiver, it should be understood that the folded cascode mixer may be used with any type of transconductance or current mode source. For example, in a radio receiver that does not include a phase shift block, the above described folded cascode mixer, or even the mixer without the low impedance cascode inputs, may be coupled directly to a low noise amplifier to receive an output of the low noise amplifier as a current signal.

Generally, one aspect of the present invention includes forming a mixer with a low impedance input in combination with a high impedance load in a prior stage to prompt current from the output of the prior stage to flow into the mixer instead of the load device or devices. The described embodiment, however, is specifically for a phase and frequency shift mixer that includes a phase shift block that produces a phase shifted current signal to a folded cascode mixer that receives the phase shifted current signal and produces a phase and frequency shifted output signal. For example, the output of the integrated phase shift mixer of FIG. 6 may be one of an intermediate band or baseband frequency signal for subsequent processing prior to conversion to a digital format for final processing by a digital processor. Generally, the described embodiment of the invention includes the low impedance cascode inputs provided by MOSFETs 424 and 426 because the MOSFETs, as configured in FIG. 6, provide lower impedance, better linearity, and less noise.

Figure 7:
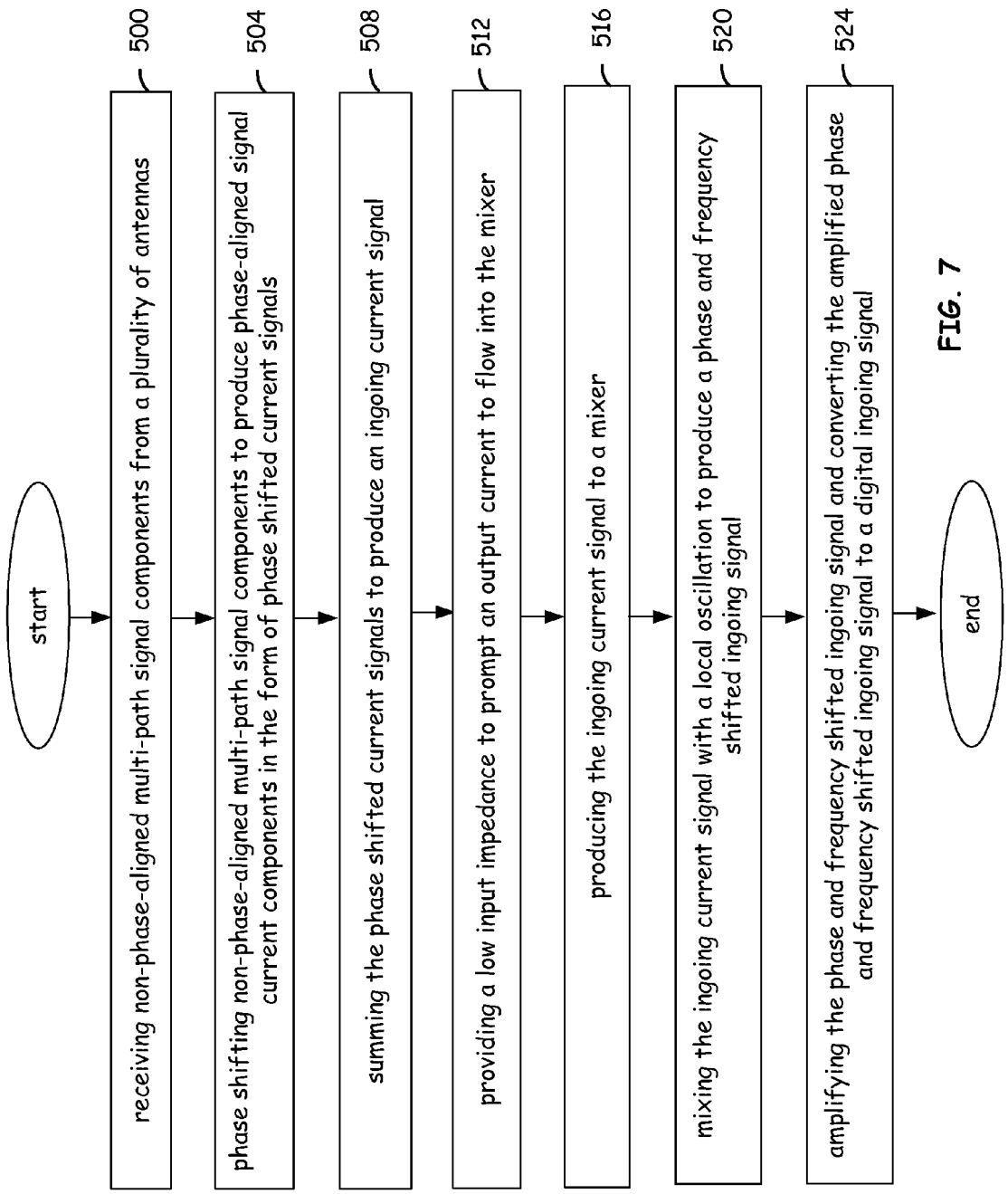
FIG. 7 is a flow chart that illustrates a method for providing phase and frequency shifted ingoing signals to a digital processor according to one embodiment of the present invention.

FIG. 7 is a flow chart that illustrates a method for providing phase and frequency shifted ingoing signals to a digital processor according to one embodiment of the present invention. Initially, the method includes receiving non-phase-aligned multi-path signal components from a plurality of antennas (STEP 500). As is known by one of average skill in the art, a transmitted radio frequency signal, because of multi-path interference, among other reasons, will arrive at a specified location as a series of multi-path signal components due to the signal being obstructed and reflected by various structures. Thus, reception may be improved by utilizing a plurality of antennas to receive the multi-path signal components. Thus, the described method includes receiving these multi-path signal components which are separated in timing or phase. Thus, a subsequent step includes phase shifting the non-phase-aligned multi-path signal components to produce phase-aligned signal current components in the form of phase shifted current signals (STEP 504). The method then includes summing the phase shifted current signals to produce an ingoing current signal (STEP 508).

As described before, a phase shift circuit is operably coupled to a high impedance load device. Accordingly, to prompt the output current to flow into a mixer as a current signal, the invention includes providing a low input impedance to prompt the output current to flow into the mixer (STEP 512). In an embodiment that includes cascoded devices at an input stage of the mixer, the invention includes producing the ingoing current signal to a mixing circuit or block, or more generally, to a mixer (STEP 516). Subsequently, the invention includes mixing the ingoing current signal with a local oscillation to produce a phase and frequency shifted ingoing signal (STEP 520). In each of the above steps starting with STEP 504, all processing has occurred on current signals. Unlike traditional circuits, the phase shift output is not converted to a voltage signal prior to being produced to a mixer. Rather, for a plurality of advantageous reasons, all signals are kept as current signals and the above method is utilized to prompt the current signals to flow into the mixer for frequency shifting or mixing. Thus, the final step of the described method includes amplifying the phase and frequency shifted ingoing signal and converting the amplified phase and frequency shifted ingoing signal to a digital ingoing signal for processing by a digital processor (STEP 524).

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled".

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention. The embodiments of the invention may also be used in other applications.

The invention claimed is:

1. An integrated circuit radio transceiver, comprising:
   a baseband processor operable to process ingoing digital communication signals and to produce outgoing digital communication signals;
   a transmitter front end operable to process and transmit outgoing RF signals based upon the outgoing digital communication signals;
   a receiver front end operable to receive ingoing RF signals and to process the ingoing RF signals to produce the ingoing digital communication signals to the baseband processor; and
   an integrated phase shift mixer for generating a phase and frequency shifted output signal to at least a portion of one of the transmitter and receiver front ends, the integrated phase shift mixer further including:
   a phase shift block operable to produce a phase shifted current signal at an output of the phase shift block; and
   a mixing block operable to produce the phase and frequency shifted output current signal based upon the phase shifted current signal.

2. The integrated circuit radio transceiver of claim 1 wherein the phase shift block is operably coupled to a high impedance load at the output of the phase shift block.

3. The integrated circuit radio transceiver of claim 2 wherein the high impedance load comprises at least one inductive element.

4. The integrated circuit radio transceiver of claim 2 wherein the mixing block comprises a folded cascode mixer that further includes a low impedance cascode input operably coupled to the output of the phase shift block to receive the phase shifted current signal.

5. The integrated circuit radio transceiver of claim 4 wherein the impedance of the load is substantially higher than the impedance of the low impedance cascode input to prompt the phase shifted current signal to flow to the low impedance cascode input instead of flowing through the high impedance load.

6. The integrated circuit radio transceiver of claim 5 wherein the low impedance cascode input comprises a source terminal of a p-channel MOSFET.

7. The integrated circuit radio transceiver of claim 3 wherein the output of the phase shift block is coupled directly to a plurality of p-channel MOSFETs of the mixing block and further wherein an input impedance of the plurality of p-channel MOSFETs is substantially lower than an impedance of the load coupled to the output of the phase shift block.

8. An integrated circuit radio receiver, comprising:
   a baseband processor operable to process ingoing digital communication signals and to produce outgoing digital communication signals;
   a receiver front end operable to receive ingoing RF signals to produce the ingoing digital communication signals to the baseband processor; and
   an integrated phase shift mixer for generating a phase and frequency shifted output signal to at least a portion of the receiver front end, the integrated phase shift mixer further including:
   a phase shift block operable to produce a phase shifted current signal at an output of the phase shift block; and
   a mixer block operable to produce the phase and frequency shifted output signal based upon the phase shifted current signal.

9. The integrated circuit radio receiver of claim 8 wherein the phase shift block is operably coupled to a high impedance load at the output of the phase shift block.

10. The integrated circuit radio receiver of claim 9 wherein the high impedance load comprises at least one inductive element.

11. The integrated circuit radio receiver of claim 9 wherein the mixer comprises a folded cascode mixer that further includes a low impedance cascode input operably coupled to the output of the phase shift block to receive the phase shifted current signal.

12. The integrated circuit radio receiver of claim 11 wherein an impedance of the high impedance load is substantially higher than an impedance of the low impedance cascode input to prompt the phase shifted current signal to flow to the low impedance cascode input instead of flowing through the high impedance load.

13. The integrated circuit radio receiver of claim 12 wherein the low impedance cascode input comprises a source terminal of a p-channel MOSFET.

14. The integrated circuit radio receiver of claim 9 wherein the output of the phase shift block is coupled directly to a plurality of p-channel MOSFETs of the mixing block and further wherein an input impedance of the plurality of p-channel MOSFETs is substantially lower than an impedance of the high impedance load coupled to the output of the phase shift block.

15. A method for phase and frequency shifting an ingoing RF communication signal, comprising:
   receiving non-phase-aligned multi-path signal components of an ingoing communication signal;
   phase shifting non-phase-aligned multi-path signal components to produce phase-aligned signal current components in the form of phase shifted current signals;
   summing the phase shifted current signals to produce an ingoing current signal;
   producing the ingoing current signal to a mixer; and
   mixing the ingoing current signal with a local oscillation to produce a phase and frequency shifted ingoing signal.

16. The method of claim 15 further including amplifying the phase and frequency shifted ingoing signal and converting the amplified phase and frequency shifted ingoing signal to a digital ingoing signal.

17. The method of claim 16 wherein the mixing step further includes, in a folded cascode mixer, providing a low input impedance to prompt an output current to flow into the folded cascode mixer.

18. The method of claim 17 further including providing, in the folded cascode mixer, the received current to a mixing block and mixing the received current with a received oscillation to produce the phase and frequency shifted ingoing signal.

19. The method of claim 15 further including receiving non-phase-aligned multi-path signal components of an ingoing communication signal from a plurality of antennas.

* * * * *